(12) United States Patent
Kim et al.

(10) Patent No.: US 8,947,882 B2
(45) Date of Patent: Feb. 3, 2015

(54) FLEXIBLE PRINTED CIRCUIT BOARD AND MOBILE TERMINAL USING THE SAME

(75) Inventors: Eujin Kim, Seoul (KR); Shin Han, Seoul (KR)

(73) Assignee: LG Electronics Inc., Seoul (KR)

( * ) Notice: Subject to any disclaimer, the term of this patent is extended or adjusted under 35 U.S.C. 154(b) by 386 days.

(21) Appl. No.: 13/332,347

(22) Filed: Dec. 20, 2011

(65) Prior Publication Data

US 2012/0268879 A1 Oct. 25, 2012

(30) Foreign Application Priority Data

Apr. 25, 2011 (KR) .................. 10-2011-0038381

(51) Int. Cl.
| | | |
|---|---|---|
| H05K 7/00 | (2006.01) | |
| H04M 1/23 | (2006.01) | |
| H04M 1/02 | (2006.01) | |
| H01H 19/58 | (2006.01) | |
| H05K 1/14 | (2006.01) | |
| H01H 13/702 | (2006.01) | |

(52) U.S. Cl.
CPC ............ *H04M 1/236* (2013.01); *H04M 1/0277* (2013.01); *H01H 19/585* (2013.01); *H05K 1/147* (2013.01); *H01H 2225/028* (2013.01); *H01H 13/702* (2013.01); *H05K 2201/0715* (2013.01)
USPC ...................... 361/728; 361/679.09

(58) Field of Classification Search
USPC .......... 361/679.01, 679.08, 679.09, 727, 728, 361/736, 748, 749
See application file for complete search history.

(56) References Cited

U.S. PATENT DOCUMENTS

| 4,066,851 | A * | 1/1978 | White et al. ................. 200/5 A |
| 4,364,619 | A * | 12/1982 | Inayat-Khan .................. 439/67 |
| 5,235,636 | A * | 8/1993 | Takagi et al. ................. 379/368 |
| 8,457,694 | B2 * | 6/2013 | Sung et al. ................. 455/575.1 |
| 2010/0075720 | A1 * | 3/2010 | Lee et al. ...................... 455/566 |
| 2013/0114199 | A1 * | 5/2013 | Jung .......................... 361/679.09 |
| 2013/0329382 | A1 * | 12/2013 | Jung ............................. 361/749 |

FOREIGN PATENT DOCUMENTS

| CN | 101422023 | 4/2009 |
| CN | 101924543 | 12/2010 |
| EP | 2007117 | 12/2008 |
| JP | 2006270035 | 10/2006 |

OTHER PUBLICATIONS

The State Intellectual Property Office of the People's Republic of China Application Serial No. 201210057334.3, Office Action dated May 28, 2014, 17 pages.

* cited by examiner

*Primary Examiner* — Bernard Rojas
(74) *Attorney, Agent, or Firm* — Lee, Hong, Degerman, Kang & Waimey

(57) ABSTRACT

Disclosed are a flexible printed circuit board and a mobile terminal using the same. The mobile terminal includes a printed circuit board (PCB), and a flexible printed circuit board (FPCB) connected to the printed circuit board. The flexible printed circuit board includes a branch extending from one side of the flexible printed circuit board, at least one switch provided on the branch and acquiring a key input signal, and a connector provided on an end portion of the branch and coupled to the flexible printed circuit board.

19 Claims, 16 Drawing Sheets

FLEXIBLE PRINTED CIRCUIT BOARD AND MOBILE TERMINAL USING THE SAME

CROSS-REFERENCE TO RELATED APPLICATIONS

Pursuant to 35 U.S.C. §119(a), this application claims the benefit of earlier filing date and right of priority to Korean Patent Application No. 10-2011-0038381, filed on Apr. 25, 2011, the contents of which is hereby incorporated by reference herein in its entirety.

BACKGROUND

1. Field

The present invention relates to a flexible printed circuit board and a mobile terminal using the same, and particularly, to a flexible printed circuit board having a switch provided at a branch extending from the flexible printed circuit board and connected to a printed circuit board, and a mobile terminal using the same.

2. Related Art

As functions of terminals such as personal computers, laptop computers, cellular phones diversify, the terminals become multimedia players having multiple functions for capturing pictures or moving images, playing music, moving image files and games and receiving broadcasting programs.

Terminals can be categorized as mobile terminals and stationary terminals. The mobile terminals can be further comprised of handheld terminals and vehicle mount terminals according to whether users can personally carry the terminals. Conventional terminals including mobile terminals provide an increasing number of complex and various functions.

To support and enhance the increasing number of functions in a terminal, improving a structural part and/or a software part of the terminal would be desirable.

SUMMARY

Accordingly, one object of the present invention is to address the above-noted and other drawbacks of the related art.

Another object of the present invention is to provide a flexible printed circuit board and a mobile terminal using the same, and particularly, to a flexible printed circuit board having a switch provided at a branch extending from the flexible printed circuit board and connected to a printed circuit board, and a mobile terminal using the same.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

The present invention will now be described more fully with reference to the accompanying drawings, in which exemplary embodiments of the invention are shown. The invention may, however, be embodied in many different forms and should not be construed as being limited to the embodiments set forth herein; rather, there embodiments are provided so that this disclosure will be thorough and complete, and will fully convey the concept of the invention to those skilled in the art.

Hereinafter, a mobile terminal relating to the present invention will be described below in more detail with reference to the accompanying drawings. In the following description, suffixes "module" and "unit" are given to components of the mobile terminal in consideration of only facilitation of description and do not have meanings or functions discriminated from each other.

The mobile terminal described in the specification can include a cellular phone, a smart phone, a laptop computer, a digital broadcasting terminal, personal digital assistants (PDA), a portable multimedia player (PMP), a navigation system and so on.

Figure 1:
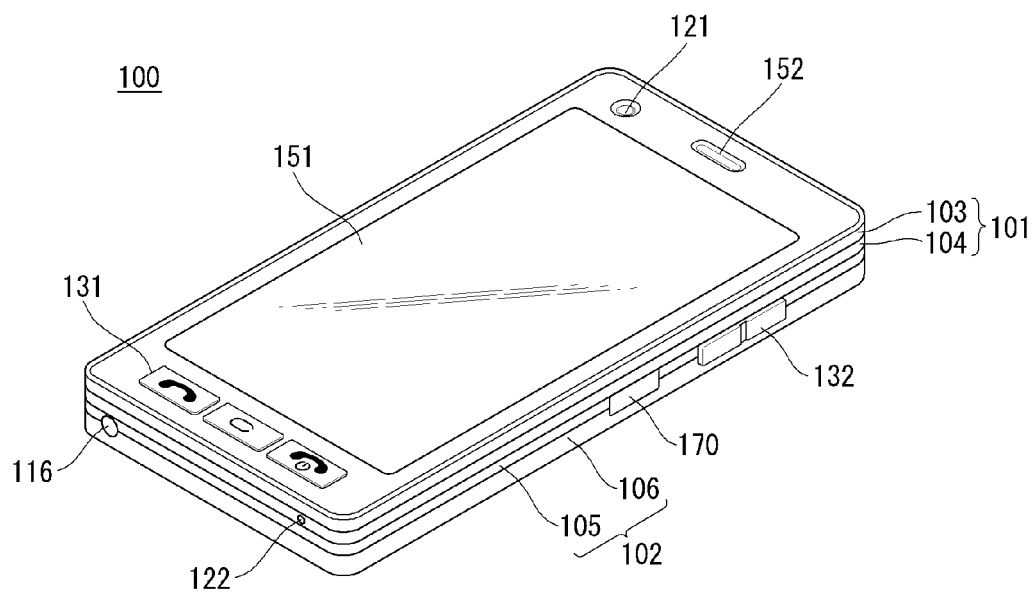
FIG. 1 is a front perspective view of a mobile terminal in a closed state according to an embodiment of the present invention.
Figure 2:
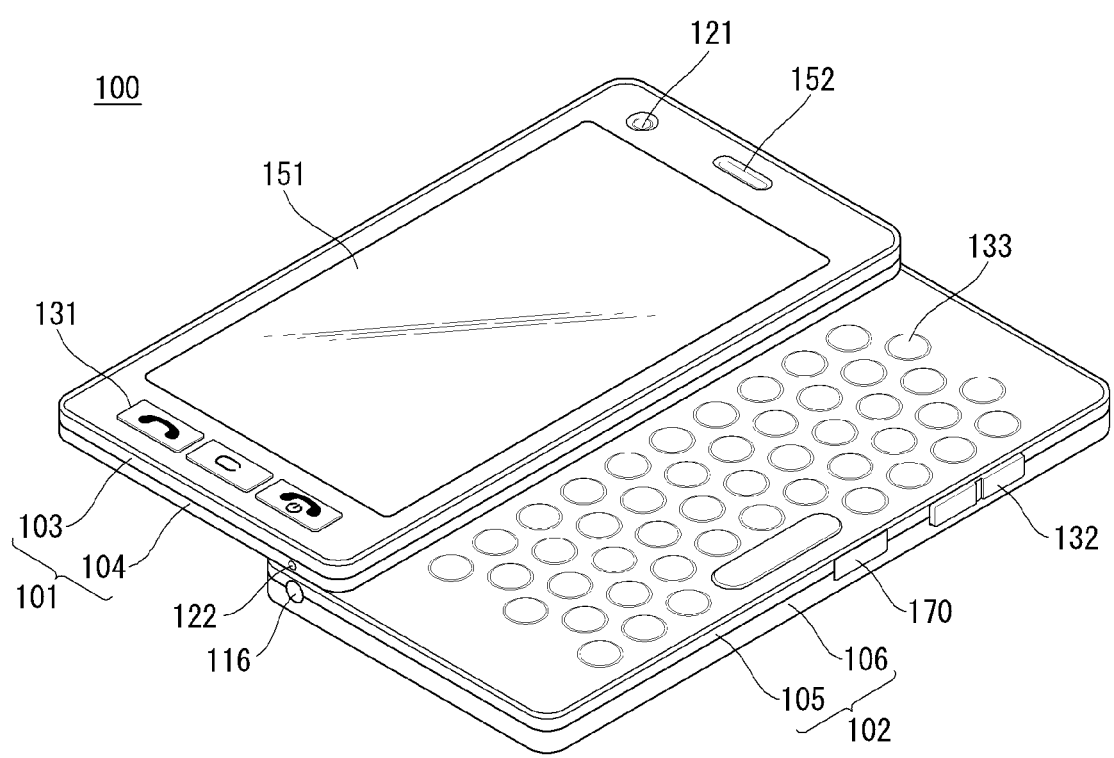
FIG. 2 is a front perspective view of the mobile terminal of FIG. 1 in an open state.

FIG. 1 is a front perspective view of a mobile terminal in a closed state according to an embodiment of the present invention, and FIG. 2 is a front perspective view of the mobile terminal of FIG. 1 in an open state.

As shown in the drawings, a mobile terminal 100 may include an upper body 101 and a lower body 102 which are slidably coupled to each other.

When the mobile terminal 100 is in a closed state, the upper body 101 overlaps the lower body 102. When the mobile terminal 100 in an open state, the upper body may be slid at a predetermined distance to the side of the lower body 102. The sliding of the upper body may occur in a width direction or a length direction of the mobile terminal 100.

The upper body 101 may be configured to be smoothly connected to the lower body 102 without a height difference in the above open state of the mobile terminal 100. That is, the upper body 101 may be configured such that when the mobile terminal enters the open state, the upper body 101 can descend toward the lower body 102 or tilt up or down at a predetermined angle.

According to the functionality and/or design of the mobile terminal 100, the upper body 101 and the lower body 102 may be equipped with various components. For example, a display 151 is installed on the front face of the upper body 101, and a keypad 133 for receiving a user's input may be installed on the upper face of the lower body 102.

The display 151 may visually display various information output by the mobile terminal 100. The display 151 may be implemented as a liquid crystal display (LCD) module, an organic light emitting diode (OLED) module, a transparent OLED module, an e-paper module, or the like.

A window covering the entire face of the display 151 may cover the entire front face of the upper body 101 so as to not form boundary lines on the front face of the upper body 101. Furthermore, as shown in FIG. 2, in order to allow for key input even when the mobile terminal 100 is in the closed state, an external key 131 may be disposed on a portion of the front face of the upper body 101.

The keypad 133 may include a plurality of keys corresponding to characters, numbers, symbols and the like. The plurality of keys included in the keypad 133 may be implemented into any one type among dome-switch, touch screen, touch pad, wheel, jog, joystick types that allow for reception of information through a user's manipulation such as push and/or touch.

An additional display, instead of the keypad 133, may be installed on the upper face of the lower body 102 so as to operate in the form of a dual display together with the display 151 of the upper body 101. In this case, a controller may support multi-tasking to cause multiple operations to be output on the respective displays.

The mobile terminal 100 may include various modules for wireless communications. That is, this means that the mobile terminal 100 wirelessly receives and transmits various data including audio signals through a radio communication unit including a broadcasting reception module, a mobile communication module, a wireless Internet module, a short-range communication module, and the like.

While a call function or the like is being executed, a first audio output module 152 may output a voice of the other party and may thus be placed at the upper side of the upper body 101 corresponding to the location of the ear of a user using the mobile terminal 100. The first audio output module 152 may be implemented in the form of a loud speaker outputting an alarm sound, a multimedia sound or the like. Also, a loud speaker may be separately provided in addition to the first audio output module 152.

An audio input module 122 may be a microphone through which the user's voice is input during the execution of a call function. The audio input module 122 may be located at the lower side of the upper body 101 corresponding to the location of the mouth of the user using the mobile terminal 100.

The upper body 101 may be formed through coupling between a first upper case 103 and a second upper case 104, and the lower body 102 may be formed through coupling between a first lower case 105 and a second lower case 106. Each of the cases 103 to 106 may be a molded object made of synthetic resin or be made of a metallic material such as stainless steel, titanium (Ti) or the like. Various components for the operation of the mobile terminal 100 may be installed inside each of the cases 103 to 106.

A first image input module 121 may be positioned at the upper body 101. The first image input module 121 may be implemented in the form of a camera module for capturing an image of the user of the mobile terminal 100 in the situations associated with a video call or the like.

A side key, a broadcasting antenna 116, an interface 170 and the like may be provided on the side face of the lower body 102.

The side key 132, as well as the manipulating key 131 of the upper body 101, may be called a manipulating portion. Any type of keys may be used for the side key 132 provided that the user can manipulate them in a tactile manner. For example, the side key 132 may be implemented into dome switch, wheel, jog, joystick types and touch screen, touch pad types, or the like.

The side key 132 may be discriminated from a different key in terms of functionality. That is, common instructions, such as character input, start, end, scroll or the like, may be received through the manipulating key 131 of the upper body 101 or the keypad 133 on the front face of the lower body 102, and the side key 132 may be a hot key that can receive instructions for activating or deactivating specific functionality such as image capturing, volume control, power ON/OFF or the like.

The broadcasting antenna 116 may be installed such that it can be drawn out from the lower body 102. That is, the user may use the antenna 116 by pulling when need arises.

The interface 170 may function as a channel for performing data exchange or the like with another electronic device. The interface 170 may be a terminal connected to an earphone, a port for short-range wireless communication, and a power supply terminal. In the case where the interface 170 is a port for short-range communication, the interface 170 may be an infrared port (IrDA port), a Bluetooth port, a Wireless LAN port, or the like. Furthermore, the interface 170 may be a socket that houses a Subscriber Identification Module (SIM), a User Identity Module (UIM), and an external memory.

Figure 3:
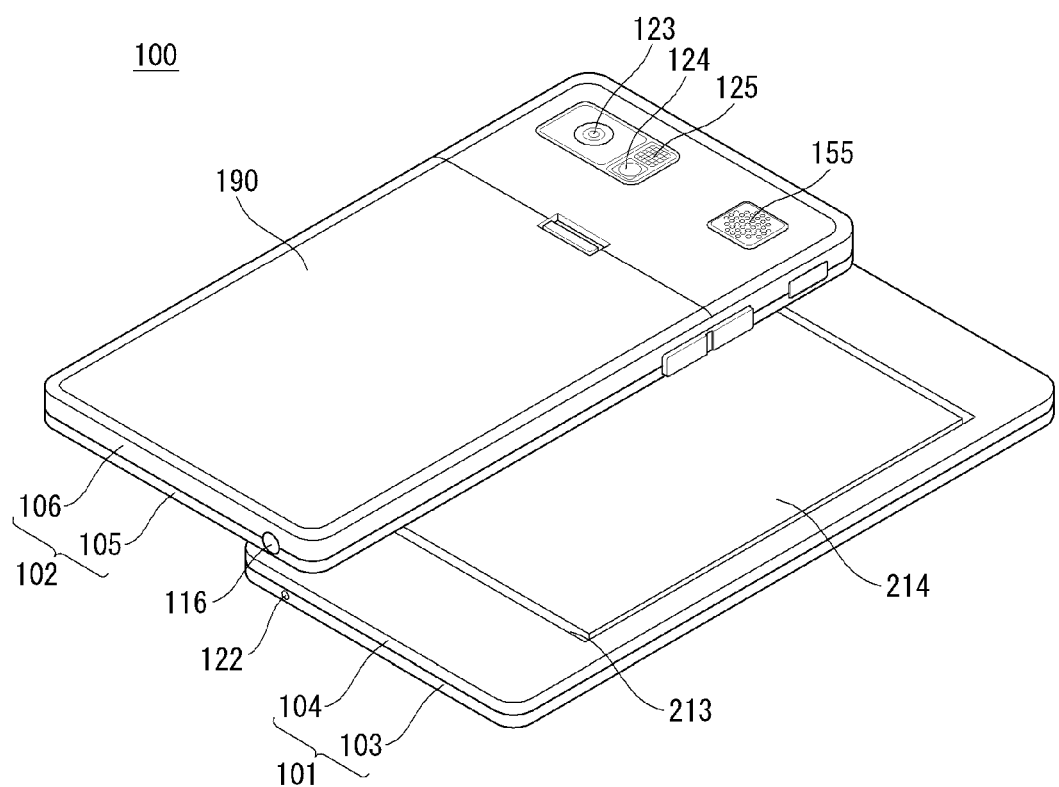
FIG. 3 is a rear perspective view of the mobile terminal depicted in FIG. 1.

FIG. 3 is a rear perspective view illustrating the mobile terminal of FIG. 1.

As shown therein, a second image input module 123 may be installed at the second lower case 106 of the lower body 102.

The second image input module 123 captures an image in the opposite direction to that of the first image input module (see 121 of FIG. 1), and may be a camera having different pixels from those of the first image input module 121. For example, the first image input module 121 is a camera with a relatively low resolution, while the second image input module 123 may have a relatively high resolution camera. A flash 125 and a mirror 124 may be additionally provided in the proximity of the second image input module 123.

The flash 125 may emit light toward an object captured by the second image input module 123.

The mirror 124 may be used to check a capturing angle or the like when the user of the mobile terminal 100 intends to capture the user with the second image input module 123.

A second audio output module 155 may be additionally located at the lower case 106. The second audio output module 155 may implement a stereo function together with the first audio output module 152, output a multimedia sound, or be used for a call in a speakerphone mode.

A battery cover 190 may be coupled to the second lower case 106. The battery cover 190 may be selectively coupled to the second lower case 106 so as to protect a battery therein from impact or moisture.

A slide plate 214 may be exposed on the rear face of the upper body 101 in order to enable the upper body 101 and the lower body 101 to be slidingly moved. Guide grooves 213 may be provided on both sides of the slide plate 214, thus smoothing the sliding motion.

Figure 4:
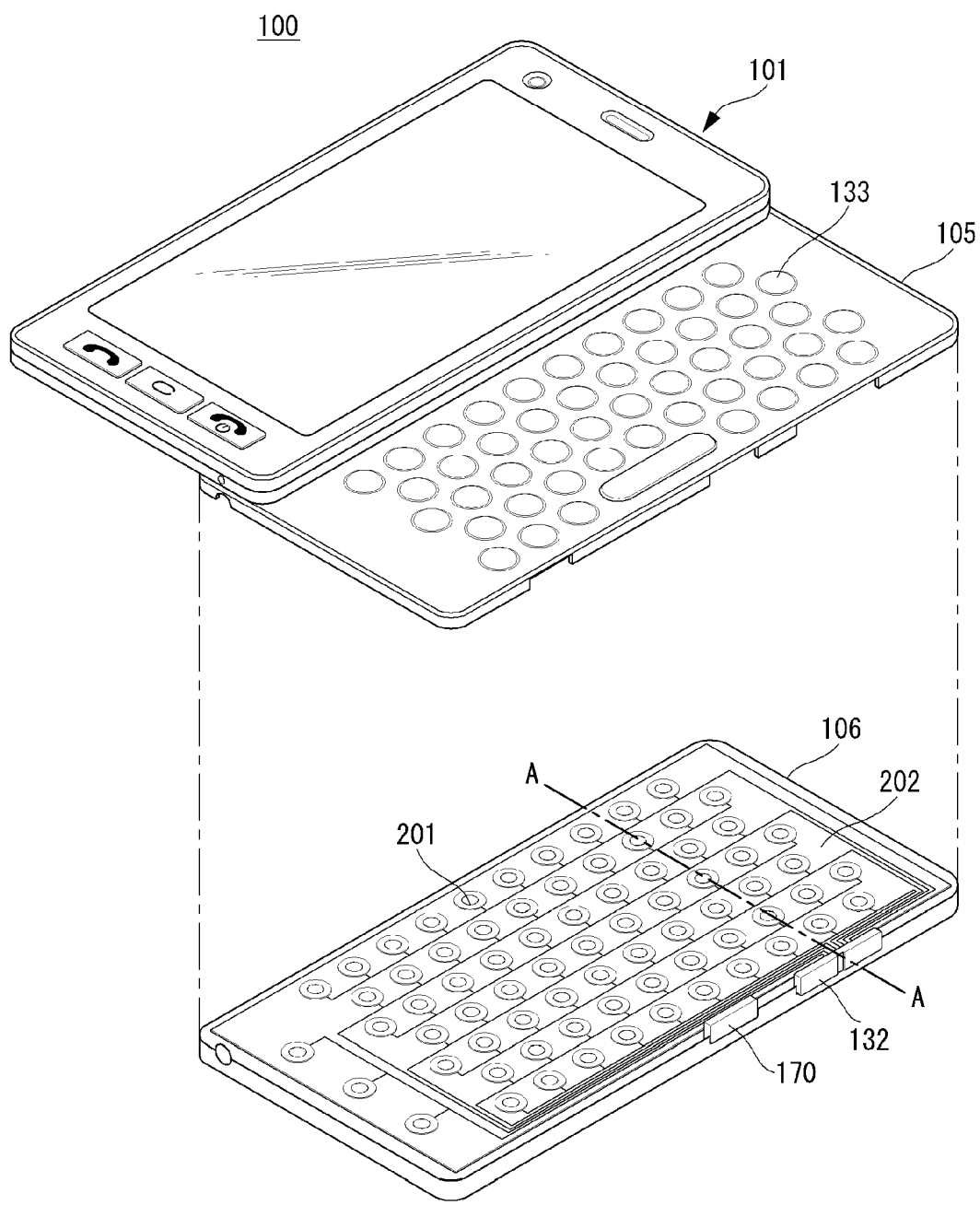
FIG. 4 is an exploded perspective view of a lower body of the mobile terminal depicted in FIG. 2.

FIG. 4 is an exploded perspective view illustrating the lower body of the mobile terminal.

As shown therein, the first lower case 105 and the second lower case 106 of the mobile terminal according to an embodiment of the present invention may have therein a flexible printed circuit board (FPCB) 202.

The flexible printed circuit board may be a printed circuit board (PCB) having flexibility. The flexible printed circuit board may be molded to be relatively small in thickness. For this reason, electronic devices becoming lighter, slimmer and smaller, such as the mobile terminal 100, employ the flexible printed circuit board. Furthermore, the flexibility of the flexible printed circuit board is appropriately bent inside the mobile terminal 100 and allows for connection with a lead wire.

The flexible printed circuit board 202 may be one that is provided with a plurality of dome switches 201 corresponding to the keypad 133 having a plurality of keys buttons and located on the upper face of the first lower case 105. In the case where the keypad 133 is configured into a QWERTY type, the dome switches 201 may be located corresponding to the buttons of the keypad 133, respectively. For the mobile terminal 100 according to an embodiment of the present invention, a description is made mainly on the case where the dome switches 201 corresponding to a QWERTY keyboard are provided. However, the present invention is not limited to the case where the dome switches 201 are provided on the flexible printed circuit board 202. For example, if a touch pad, a display such as an LCD or the like is located at the position of a QWERTY keyboard, the flexible printed circuit board 202 may be used as an interface for signal exchange with the touch pad or the display. That is, the flexible printed circuit board 202 may serve to provide a path of a signal line between a printed circuit board 205 and the touch pad or the display.

Each of the dome switches 201 may repeat between its initial state and a deformed state according to the vertical motion of the keypad 133 as the user presses the keypad 133. While repeating between the initial state and the deformed state, the dome switch 201 undergoes intermittence, thus generating a signal. The controller of the mobile terminal 100 may determine which button the user has pushed on the basis of a unique signal generated as the dome switch 201 is pushed.

Figure 5:
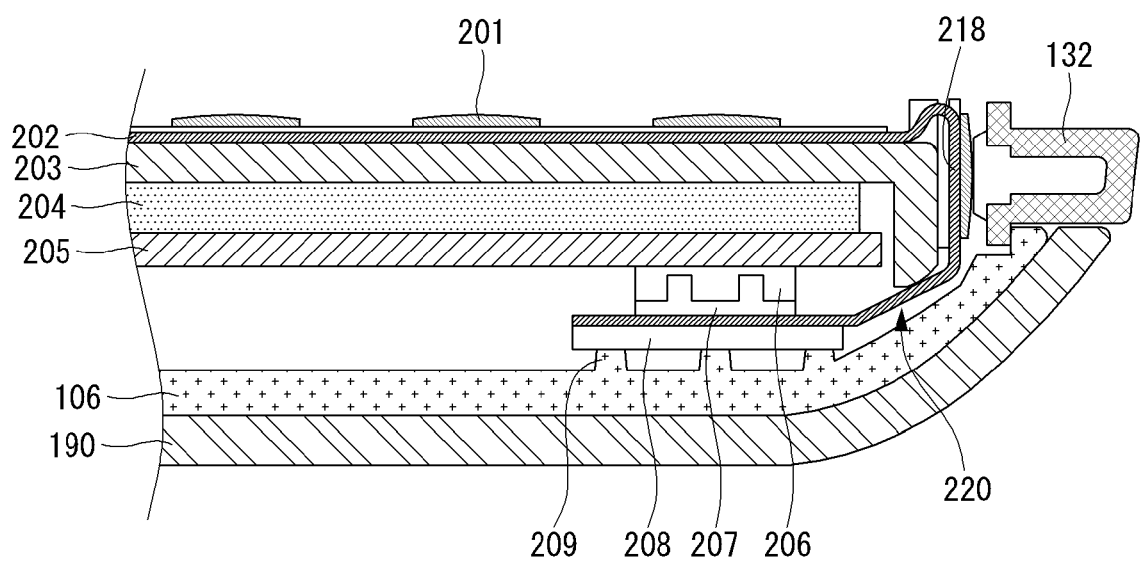
FIG. 5 is a cross-sectional view of the lower body of FIG. 4 taken along line A-A.

A signal generated by the intermittence of the dome switch 201 may be transmitted to a printed circuit board 205 of FIG. 5 where the controller is located. In order to transmit the signal generated from the dome switch 201 to the printed circuit board 205 of FIG. 5 the flexible printed circuit board 202 having the dome switch 201 and the printed circuit board 205 of FIG. 5 having the controller thereon need to be electrically connected to each other. In the mobile terminal 100 according to an embodiment of the present invention, the printed circuit board 205 of FIG. 5 and the flexible printed circuit board 202 may be connected to each other by the medium of a branch 220 of FIG. 5 extending from the flexible printed circuit board 202. Furthermore, the branch 220 of FIG. 5 may be provided with a switch allowing for the acquisition of a user's input signal with respect to the side key 132.

FIG. 5 is a cross-sectional view of the lower body taken along line A-A of FIG. 4.

As shown therein, the mobile terminal 100 according to an embodiment of the present invention may include the flexible printed circuit board 202 and the printed circuit board 205. A frame 203 and a shield can 204 may be located between the flexible printed circuit board 202 and the printed circuit board 205.

The flexible printed circuit board 202 may have a plurality of dome switches provide on one surface thereof. If the dome switch 201 is pushed, then a generated signal may be transmitted to the printed circuit board 205 through the branch 202.

Figure 8:
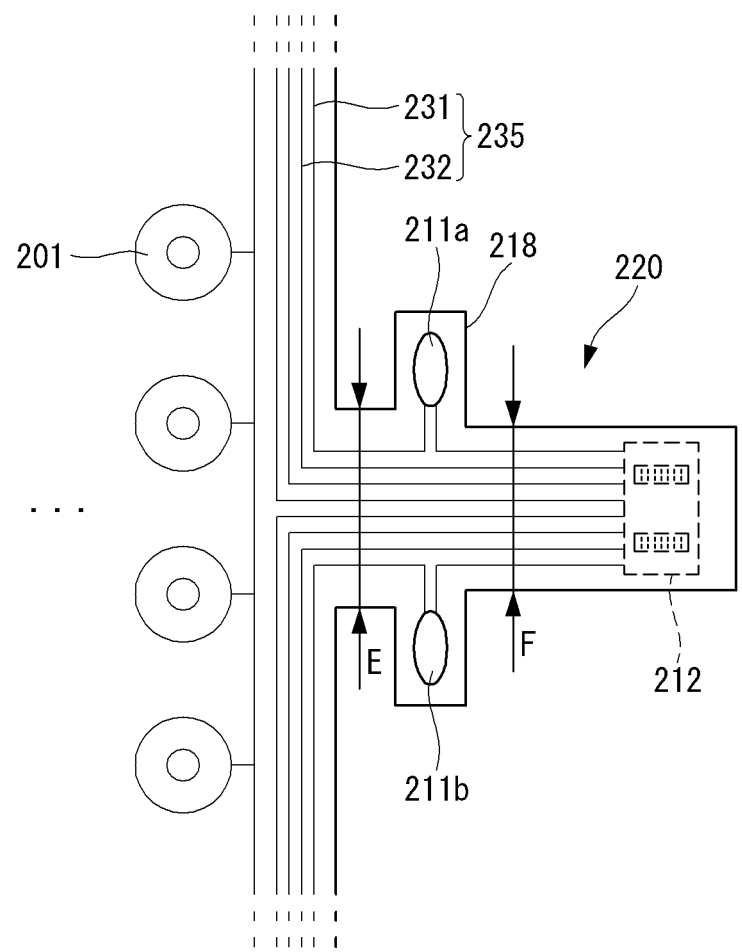
FIG. 8 is an enlarged view of the flexible printed circuit board depicted in FIG. 6.

The branch 220 may be a structure extending from one side of the flexible printed circuit board 202. That is, the branch 220 may be an integral structure with the flexible printed circuit board 202. The branch 220 extending from the flexible printed circuit board 202 may be bent inside the second lower case 106 and extend to a suitable position for coupling. A signal line 235 of FIG. 8 may be formed on the branch 220. The signal line 235 of FIG. 8 is a path of an electrical signal between the flexible printed circuit board 202 and the printed circuit board 205. A switch region 218 may be provided on a path of the branch 220 extending from the flexible printed circuit board 202 to the printed circuit board 205.

The switch region 218 may be a region where a dome switch allowing for the acquisition of the user's push input signal with respect to the side key 132 is located. Since the switch region 218 is located in the middle of the branch 220, there is no need for a separate structure for the side key 132. Thus, the assembly properties of the mobile terminal 100 can be improved, and a reduction in costs can be expected. The branch 220 may have a connector 207 provided on its end portion after the switch region 218.

The connector 207 is coupled to a receiving portion 206 provided on the flexible printed circuit board 202, thereby electrically connecting the flexible printed circuit board 202 with the printed circuit board 205. That is, the connector 207 coupled in the receiving portion 206 allows electrical signals to be transmitted between the flexible printed circuit board 202 and the printed circuit board 205. The connector 207 may be pushed by a rib 209.

The rib 209 may be structure protruding inwardly from the second lower case 106. A plurality of rib 209 may be arranged at predetermined intervals. The plurality of ribs 209 push the connector 207 toward the flexible printed circuit board 202, thereby allowing the connector 207 to be more firmly secured in the receiving portion 206.

A shock absorber 208 may be located between the rib 209 and the connector 207. The shock absorber 208 may be made of a rubber material. The shock absorber 208 of a rubber material may prevent external shock from being directly transmitted to the connector 207 through the rib 209.

The printed circuit board 205 may be a printed circuit board on which electronic components, such as a controller generating a control signal for the execution of any function of the mobile terminal 100, are mounted. That is, the printed circuit board 205 may be substantially a main printed circuit board, and the flexible printed circuit board 202 may be a circuit board generating and transferring a user input signal for the control operation of the printed circuit board 205.

The printed circuit board 205 may be greater than the flexible printed circuit board 202 in terms of thickness. As mentioned above, various electronic components may be mounted on the printed circuit board 205. In order to mount a plurality of electronic components, the printed circuit board 205 may be a multilayer board where a plurality of layers are stacked.

The printed circuit board 205 may be smaller in width than the flexible printed circuit board 202. As mentioned above, considering that the flexible printed circuit board 202 includes the dome switches 201 respectively corresponding to keys of the keypad 133 of FIG. 4, the flexible printed circuit board 202 may have a width substantially similar to the length and width of the mobile terminal 100. In contrast, since the printed circuit board 205 is a multilayer board, it may be thicker but narrower than the flexible printed circuit board 202. For example, the printed circuit board 205 may be located in a region that does not overlap a battery 300 of FIG. 6. Since the printed circuit board 205 is located so as to not overlie the battery 300 of FIG. 6, the mobile terminal 100 may have a slim design The frame 203 may be located under the flexible printed circuit board 202. The frame 203 supports the flexible printed circuit board 202 such that the flexible printed circuit board 202 is not moved inwardly of the mobile terminal 100 by the user's push input, and other electronic devices therein can be protected from external shock.

The shield can 204 protects the printed circuit board 205 from electromagnetic waves while preventing generated electromagnetic waves from radiating to the outside.

Figure 6:
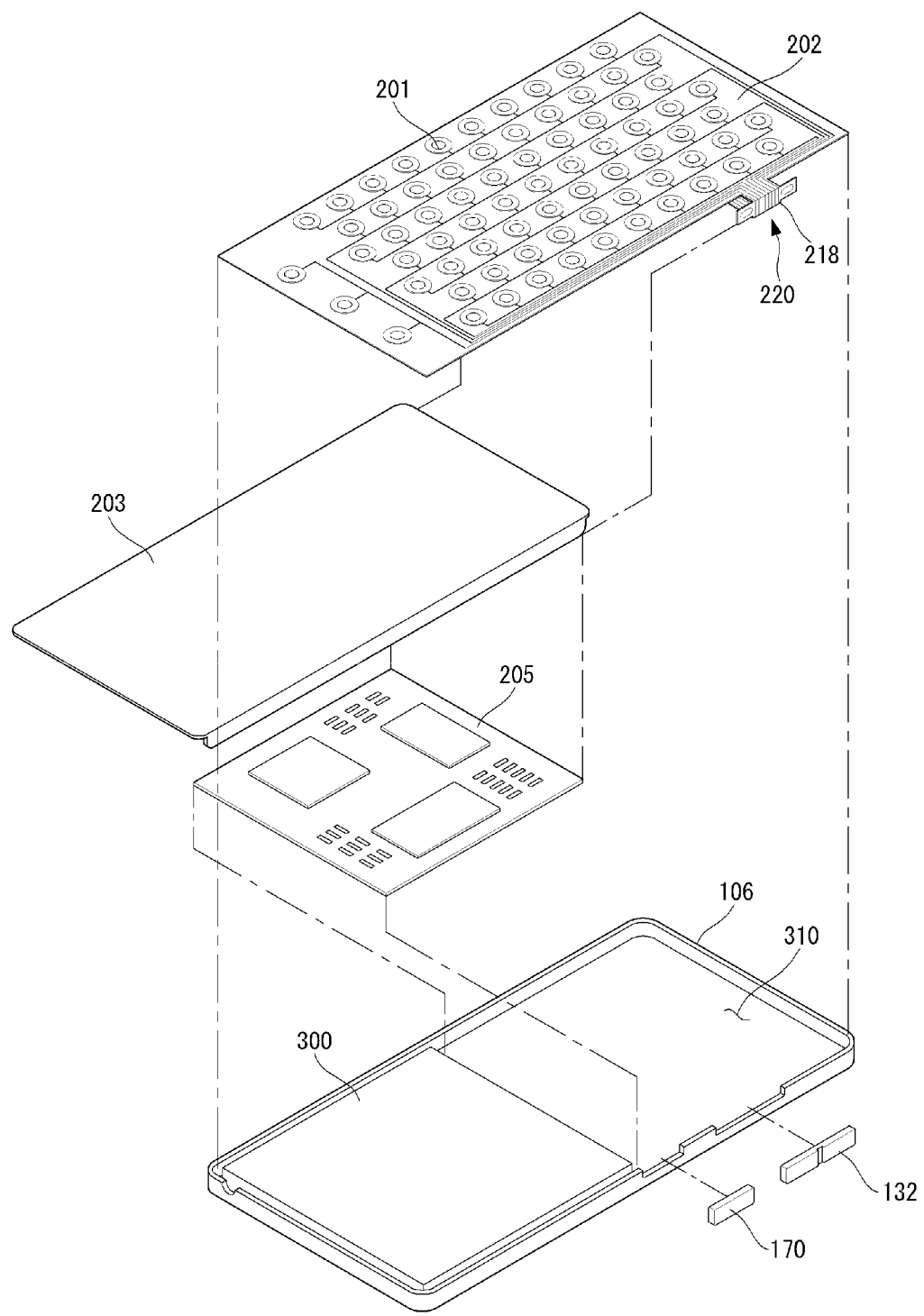
FIG. 6 is a view illustrating coupling relationship of the lower body of the mobile terminal depicted in FIG. 2.

FIG. 6 is a view illustrating coupling relationship of the lower body of the mobile terminal illustrated in FIG. 2.

As shown therein, in the mobile terminal 100 according to an embodiment of the present invention, components such as the frame 203 and the printed circuit board 205 may be located under the flexible printed circuit board 202.

The flexible printed circuit board 202 may substantially correspond to the area of the second lower case 106, while the printed circuit board 205 may be located in a board mounting region 310. The board mounting region 310 may not overlap a region where the battery 300 is provided. That is, when viewed with reference to the thickness direction of the mobile terminal 100, the flexible printed circuit board 202 and the printed circuit board 205 are stacked (overlap each other), while the battery 300 and the printed circuit board 205 are located in separate regions. The relatively thick printed circuit board 205 is located in the board mounting region 310 without overlapping the battery 300, and thus the mobile terminal 100 can be designed to be slim. The branch 220 extending from the flexible printed circuit board 202 is bent twice and extends inwardly of the mobile terminal 100.

The switch region 218 provided on the path of the branch 220 may be exposed to the side direction of the mobile terminal 100. The side key 132 may be coupled to the switch region 218 exposed in the side direction.

Figure 7:
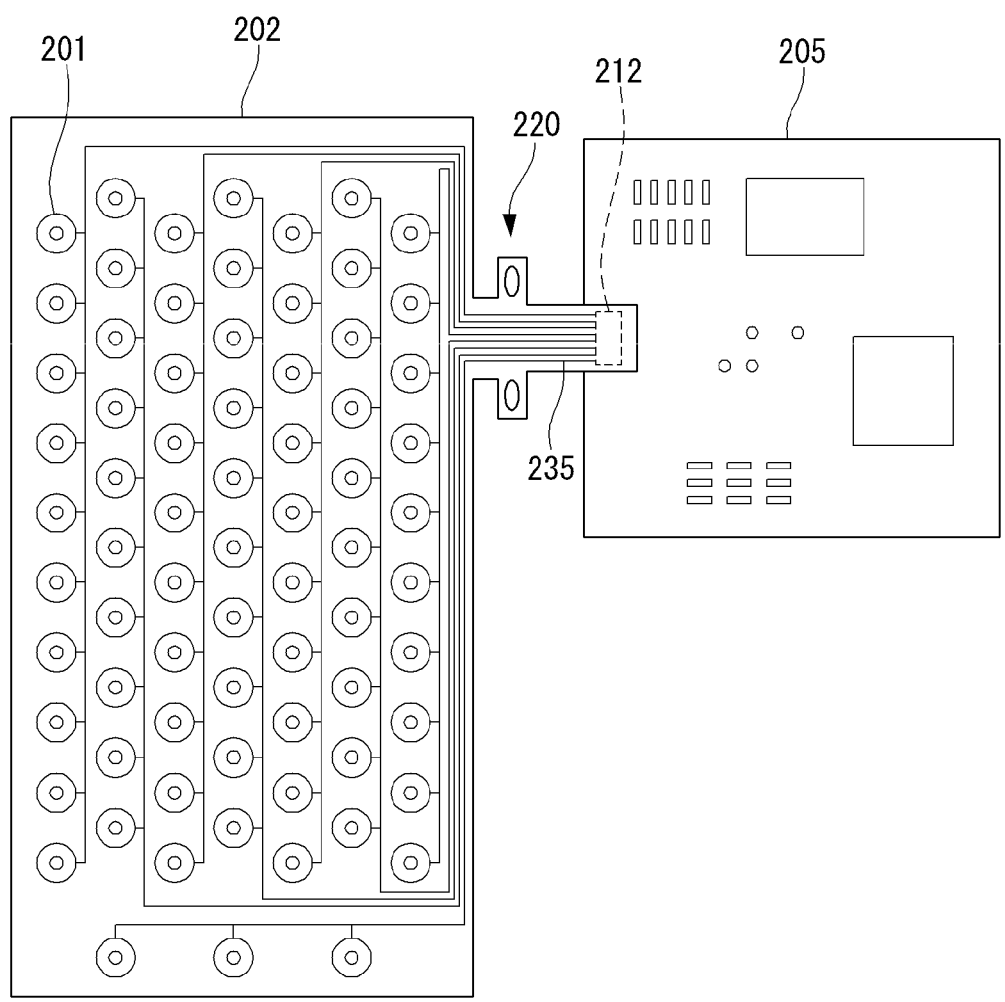
FIG. 7 is a view illustrating coupling relationship of a printed circuit board and a flexible printed circuit board of the mobile terminal depicted in FIG. 6.

FIG. 7 is a view illustrating coupling relationship between the printed circuit board and the flexible printed circuit board of the mobile terminal illustrated in FIG. 6.

As shown therein, the printed circuit board 205 and the flexible printed circuit board 202 of the mobile terminal, according to an embodiment of the present invention, may be coupled to each other by the connector 212 provided on the branch 220.

The branch 220 may be provided with the signal line 235. The signal line 235 may be a path through which signals are transmitted between the flexible printed circuit board 202 and the printed circuit board 205.

When assembled into the mobile terminal 100, the branch 220 is bent twice in the same direction. Accordingly, the flexible printed circuit board 202 and the printed circuit board 205 are located inside the mobile terminal 100 in a vertically overlapping manner.

The connector may be provided on the flexible printed circuit board 202 so as to be physically coupled to the printed circuit board 205.

FIG. 8 is an enlarged view illustrating the flexible printed circuit board of FIG. 6.

As described above, the dome switches 201 may be located on the flexible printed circuit board 202. A plurality of signal lines 235 may extend from the plurality of dome switches 201 placed on the flexible printed circuit board 202.

The signal lines 235 may pass through the branch 220 and extend to the connector 212. Since the connector 212 is connected to the printed circuit board 205, key input signals may be delivered through the signal lines 235.

The switch region 218 may be a region expanded in width compared to other portions of the branch 220. First and second dome switches 211*a* and 211*b* may be placed in the switch region 218. The first and second dome switches 211*a* and 211*b* may correspond to a function such as volume up/down, channel up/down, or the like. The first and second dome switches 211*a* and 211*b* placed in the switch region 218 expanded in width can avoid interfering with the path of the signal lines 235. The signal lines 235 may include a first lead wire 231 connected to the first and second dome switches 211*a* and 211*b*, and a second lead wire 232 which is not.

A first width E, a width of a region at which the switch region 218 is started may be greater than a second width F, a width of a region at which the switch region 218 is ended. The reason why the first width E is provided to be greater than the second width F may be due to the number of signal lines 235 lying thereon. For example, there may be the case where the first lead wire 231 is connected only up to the first dome switch 211*a*. If the signal lines 235 are connected only up to the first and second dome switches 211*a* and 211*b*, the number of signal lines 235 from the first dome switch 211*a* up to the connector 212 may be smaller than the number of signal lines 235 from the flexible printed circuit board 202 to the first dome switch 211*a*. Therefore, the second width F may be smaller than the first width E by a reduced number of signal lines.

By optimizing the first and second widths E and F corresponding to the number of signal lines 23 respectively passing thereover, the branch 220 can maintain a certain level of rigidity while occupying the minimum volume.

The connector 212 may be provided at an end portion of the branch 220. The signal lines 235 extending from the dome switch 201 and/or the first and second dome switches 211*a* and 211*b* may be connected to the connector 212 by way of the branch 220. The connector 212 may be connected to the printed circuit board 205 to deliver relevant signals.

Figure 9:
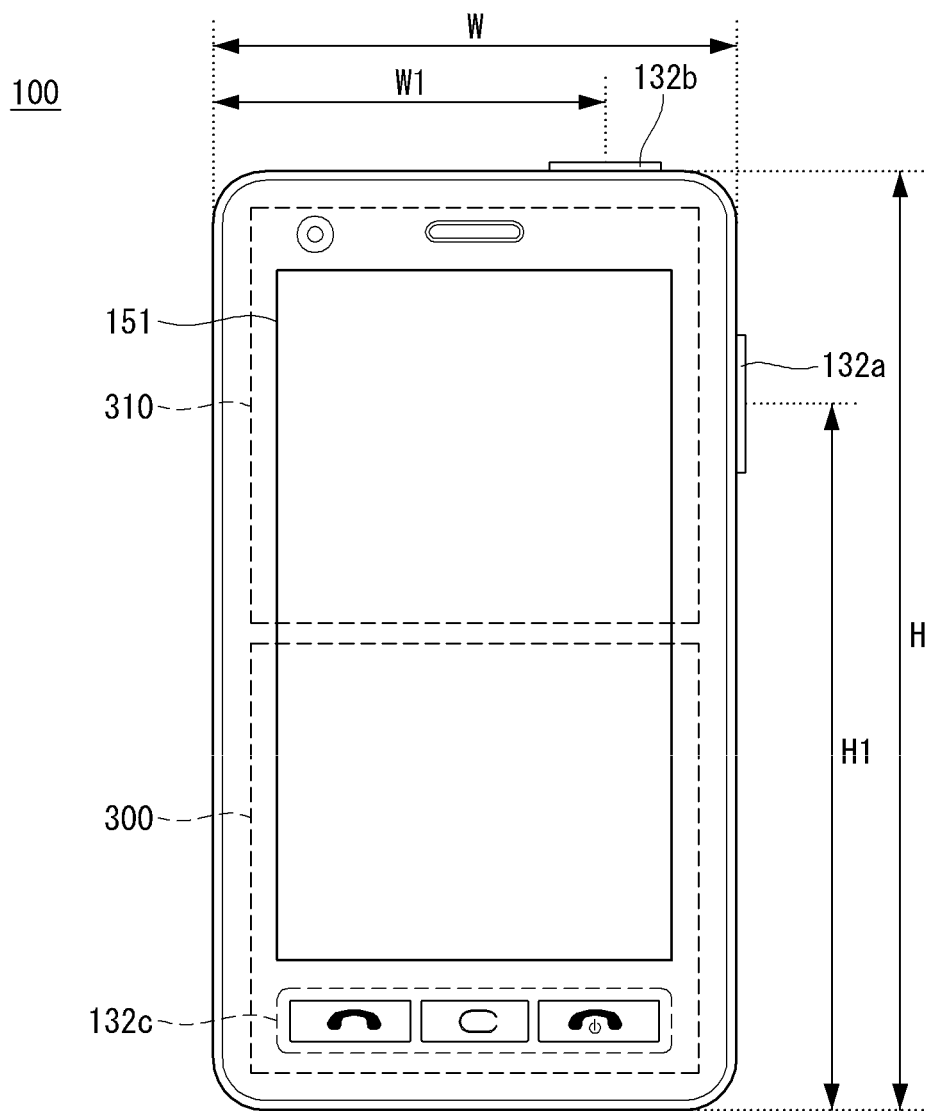
FIG. 9 is a plan view of a mobile terminal according to an embodiment of the present invention.

FIG. 9 is a plan view of a mobile terminal according to an embodiment of the present invention.

As shown therein, the mobile terminal 100 according to an embodiment of the present invention may have first to third side keys 132*a*, 132*b* and 132*c* placed at various locations.

The first side key 132*a* may be placed on the left and/or right side of the mobile terminal 100. Assuming that the length of the mobile terminal 100 is H, the first side key 132*a* may be placed at a point H1. The point H1 may be at a location as high as 70% to 75% of the total length of the mobile terminal 100 from the lower end of the mobile terminal 100. That is, the point H1 may be a spot where the user's finger is naturally located when the user holds the mobile terminal 100.

The first side key 132*a* may be associated with the location of the board mounting region 310 and/or the battery 300. That is, this means that the first side key 132*a* may be placed on the right and/or left side of the board mounting region 310 in which the printed circuit board 205 is located. Since the branch 220 of FIG. 10 extending from the flexible printed circuit board 202 of FIG. 10 is connected to the printed circuit board 205, placing the first side key 132 in proximity to the printed circuit board 205 may be advantageous in terms of assembly and unit costs.

The second side key 132 may be placed on the upper and/or lower side of the mobile terminal 100. The second side key 132 may be located at a point W1 where W denotes the width of the mobile terminal 100. The point W1 may be located at a spot corresponding to 70% to 75% of the total width W of the mobile terminal 100 from the very left or right side of the mobile terminal 100.

The third side key 132c may be placed on the front and/or rear face of the mobile terminal 100. The third side key 132c may be located outside a region of the display 151.

Figure 10:
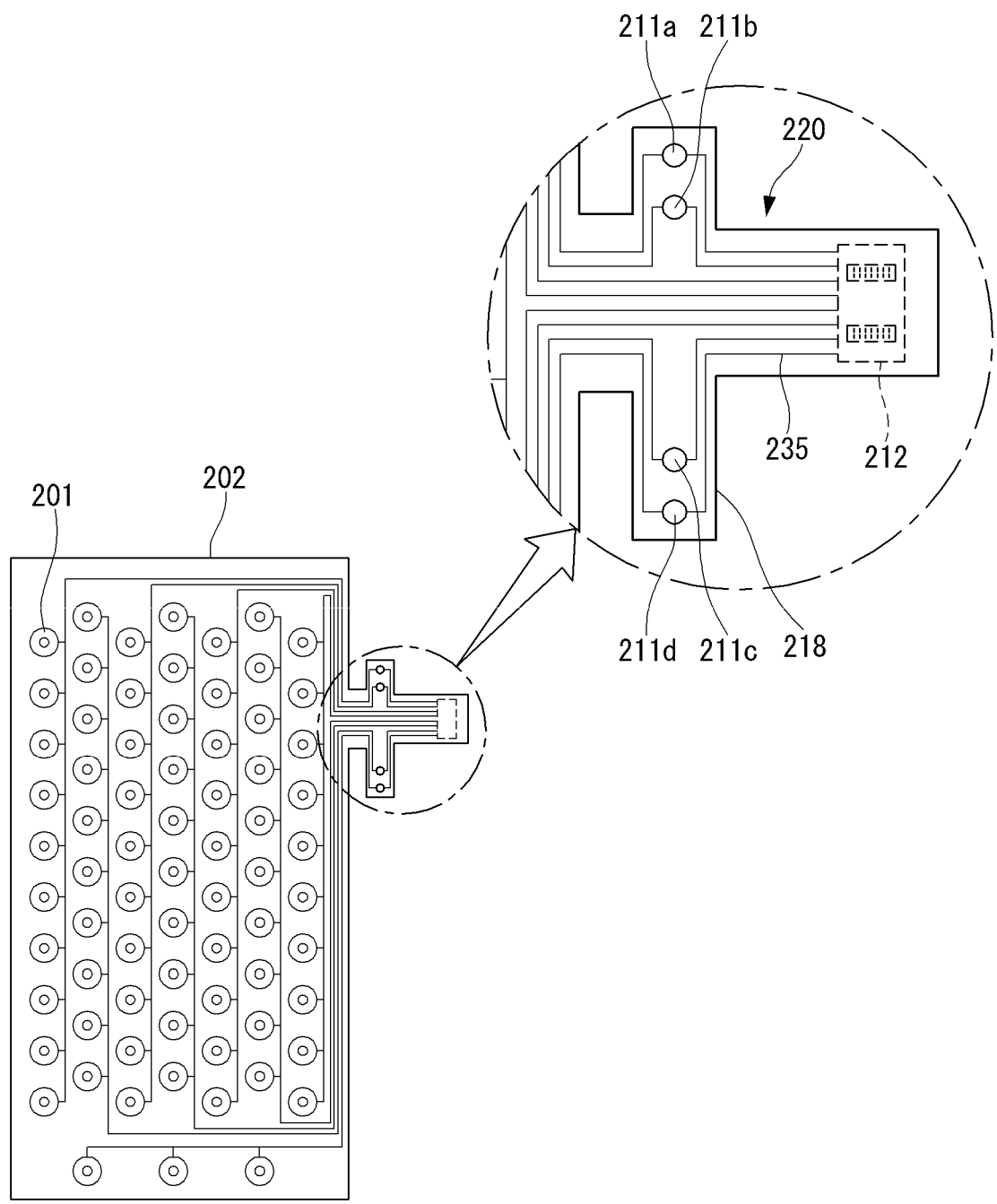
FIG. 10 is a view illustrating a flexible printed circuit board of a mobile terminal according to another embodiment of the present invention.

FIG. 10 is a view illustrating a flexible printed circuit board of a mobile terminal according to another embodiment of the present invention.

As shown therein, in the flexible printed circuit board 202 of the mobile terminal 100, according to another embodiment of the present invention, a plurality of dome switches 211a to 211d may be placed in the switch region 218 on the branch 220.

In general, each two of the dome switches 211a to 211d are paired up to perform a specific function. For example two dome switched may be paired up to serve as volume keys or channel keys. Accordingly, as shown in FIG. 10, in the case where four dome switches 211a to 211d are provided in the switch region 218, there may correspond to two side keys.

Since a single branch 220 may be made to correspond a plurality of side keys, the spatial limitation caused when a plurality of branches 220 are formed can be overcome. Furthermore, the dome switches 211a to 211d are located on the branch 220 through which the signal lines 235 have already passed, thus eliminating inconvenience of separately configuring signal lines 235.

Figure 11:
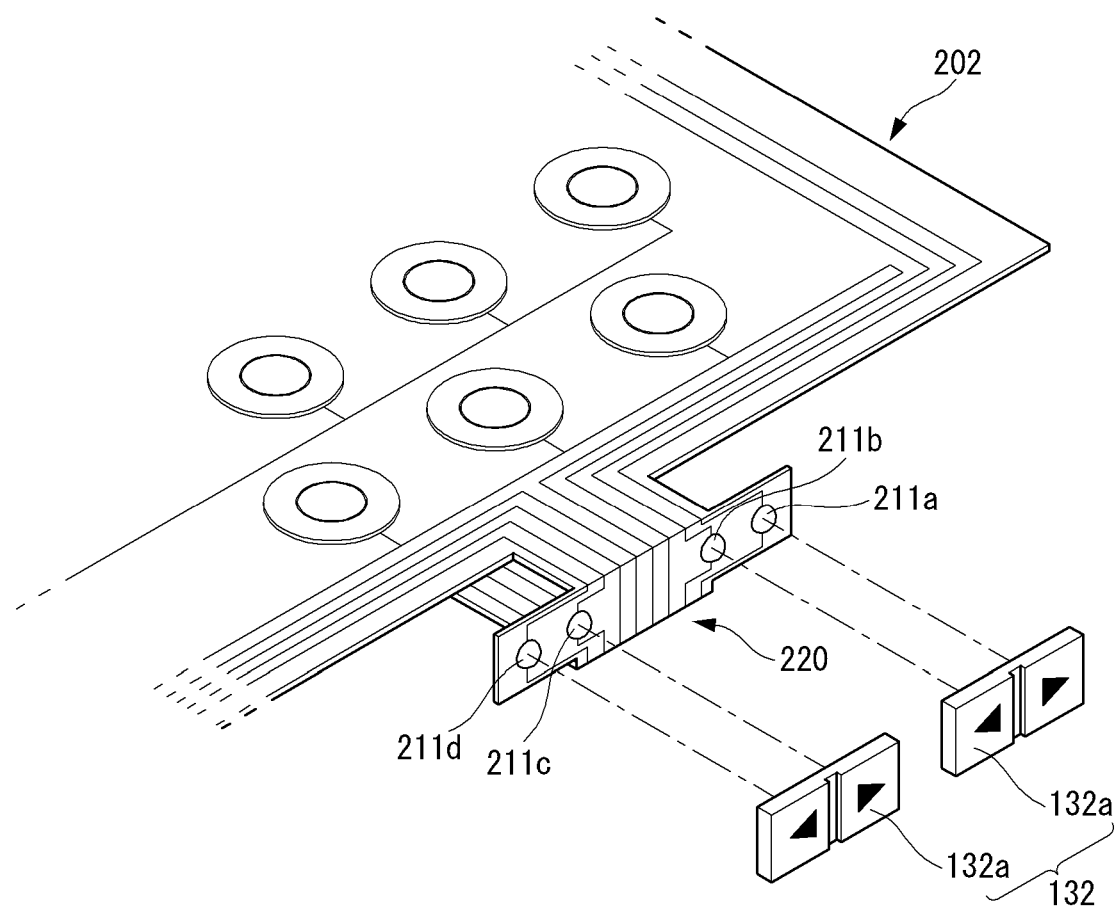
FIG. 11 is a view illustrating coupling relationship of a side key and a flexible printed circuit board of FIG. 10.

FIG. 11 is a view illustrating coupling relationship between the side keys and the flexible printed circuit board illustrated in FIG. 10.

A plurality of side keys 132 may be coupled to the branch 220 extending from the flexible printed circuit board 202 according to another embodiment of the present invention.

The side keys 132 may include first and second side keys 132a and 132b. The first side key 132a may correspond to first and second dome switches 211a and 211b, and the second side key 132b may correspond to third and fourth dome switches 211c and 211d.

The plurality of side keys 132a and 132b may be caused to correspond to a single branch 220, thus eliminating spatial limitation and difficulties in processing required in forming a plurality of branches 220.

Figure 12:
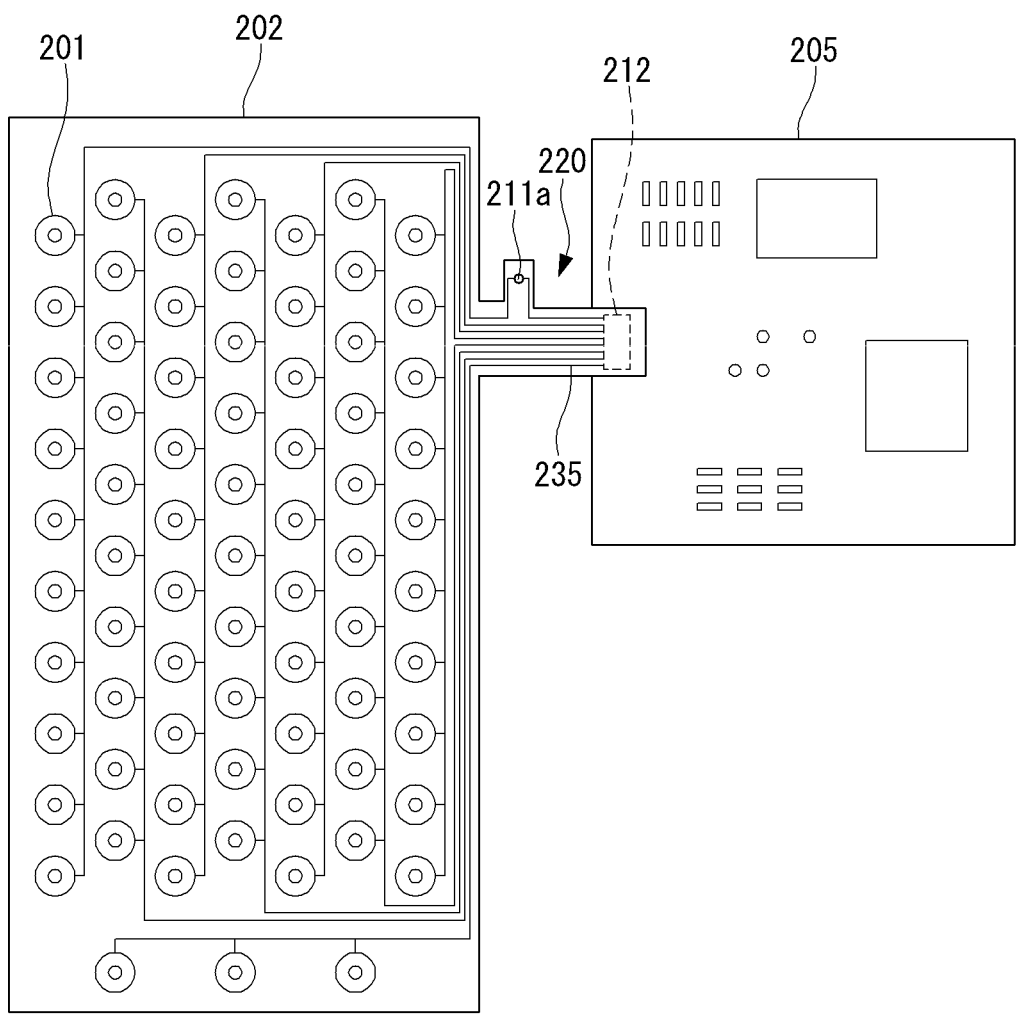
FIG. 12 is a view illustrating a branch of a flexible printed circuit board according to another embodiment of the present invention.

FIG. 12 is a view illustrating a branch of a flexible printed circuit board according to another embodiment of the present invention.

As shown therein, a first dome switch 211a may be asymmetrically located on the branch 202 extending from the flexible printed circuit board 202. That is, only the first dome switch 211a may be provided unlike FIG. 8 where the first and second dome switches 211a and 211b are placed on the branch 220.

The first dome switch 211a may correspond to an input key corresponding to a specific function such as power ON/OFF, the execution of a camera function, or the like.

Figure 13:
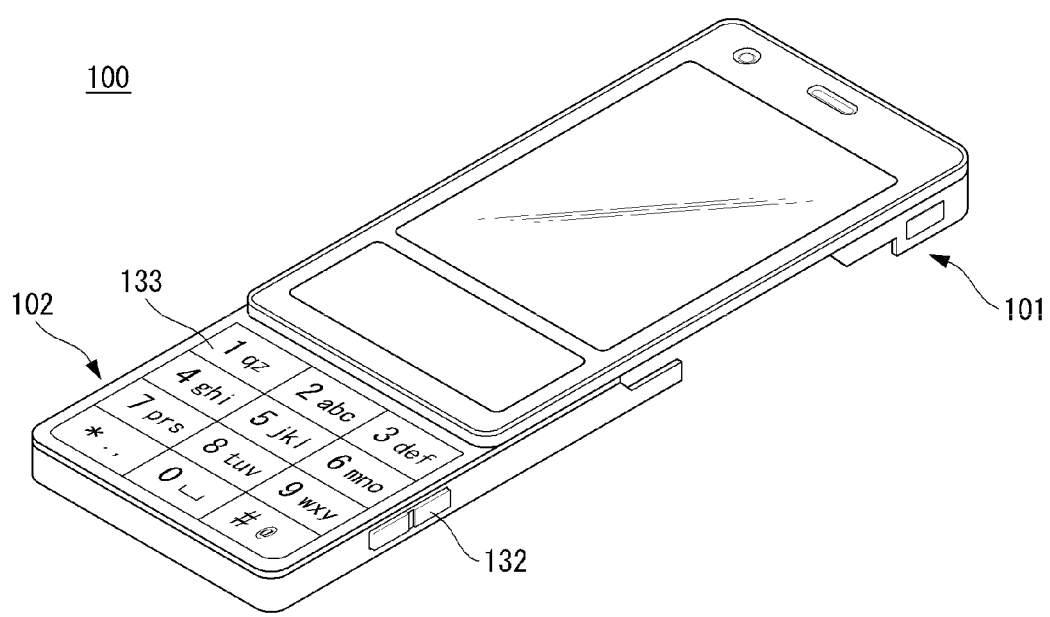
FIGS. 13 and 14 are views illustrating a mobile terminal according to another embodiment of the present invention.
Figure 14:
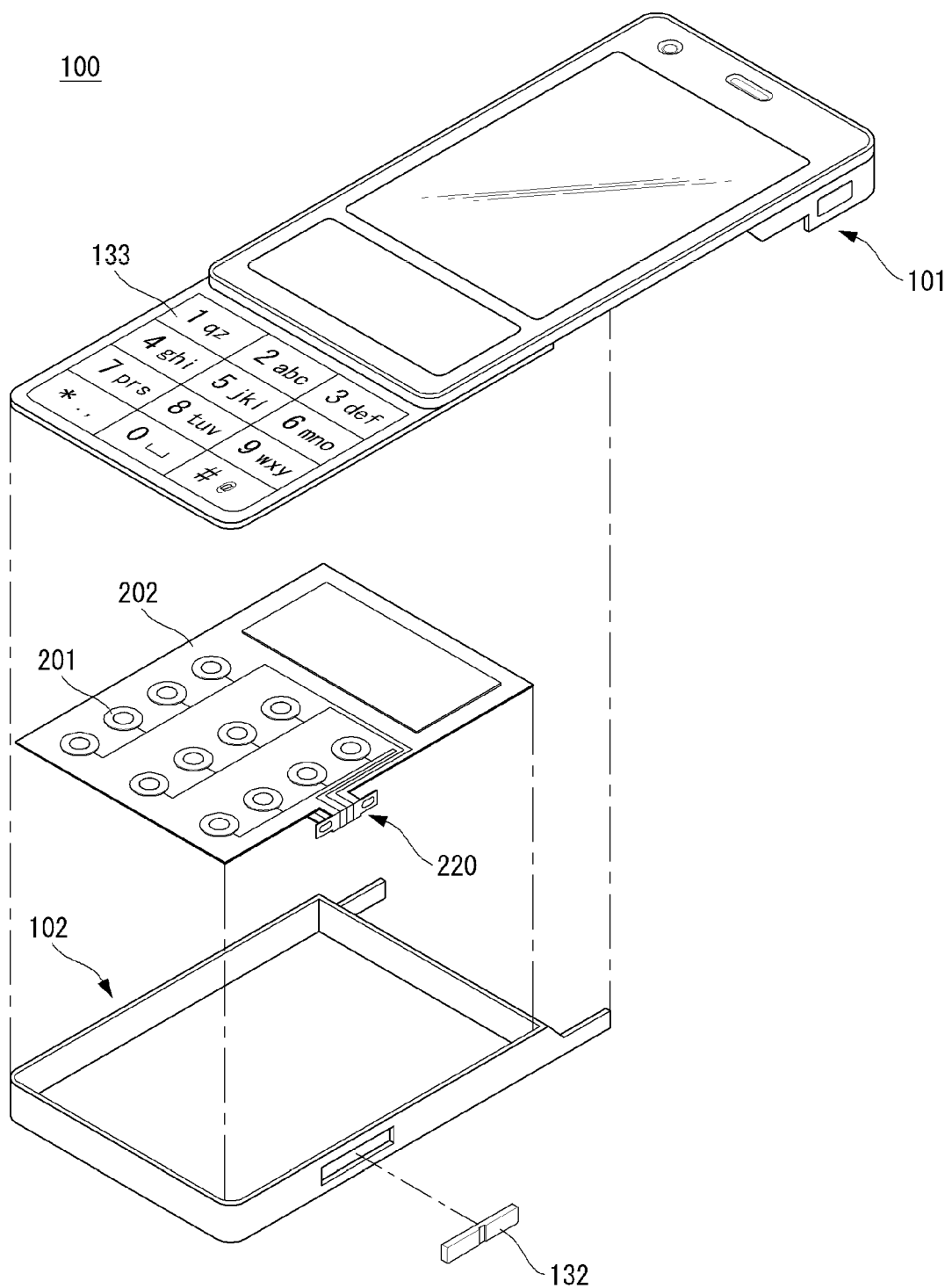

FIGS. 13 and 14 are views illustrating a mobile terminal according to another embodiment of the present invention.

As shown in FIG. 13, the mobile terminal 100, according to another embodiment of the present invention, may have a structure a key pad 133 is exposed as upper and lower bodies 101 and 102 are slid. That is, if the lower body 102 is inserted in the length direction of the upper body 101, the mobile terminal 100 enters a closed state, and otherwise, the mobile terminal 100 may enter an open state. Side keys may be placed on the side face of the mobile terminal 100.

As shown in FIG. 14, the flexible printed circuit board may be contained in the lower body 102. Dome switches 201 corresponding to the key pad 133 may be placed on the flexible printed circuit board 202. The branch 220 may extend from the flexible printed circuit board 202. The branch 220 may be located corresponding to the side keys 13.

Figure 15:
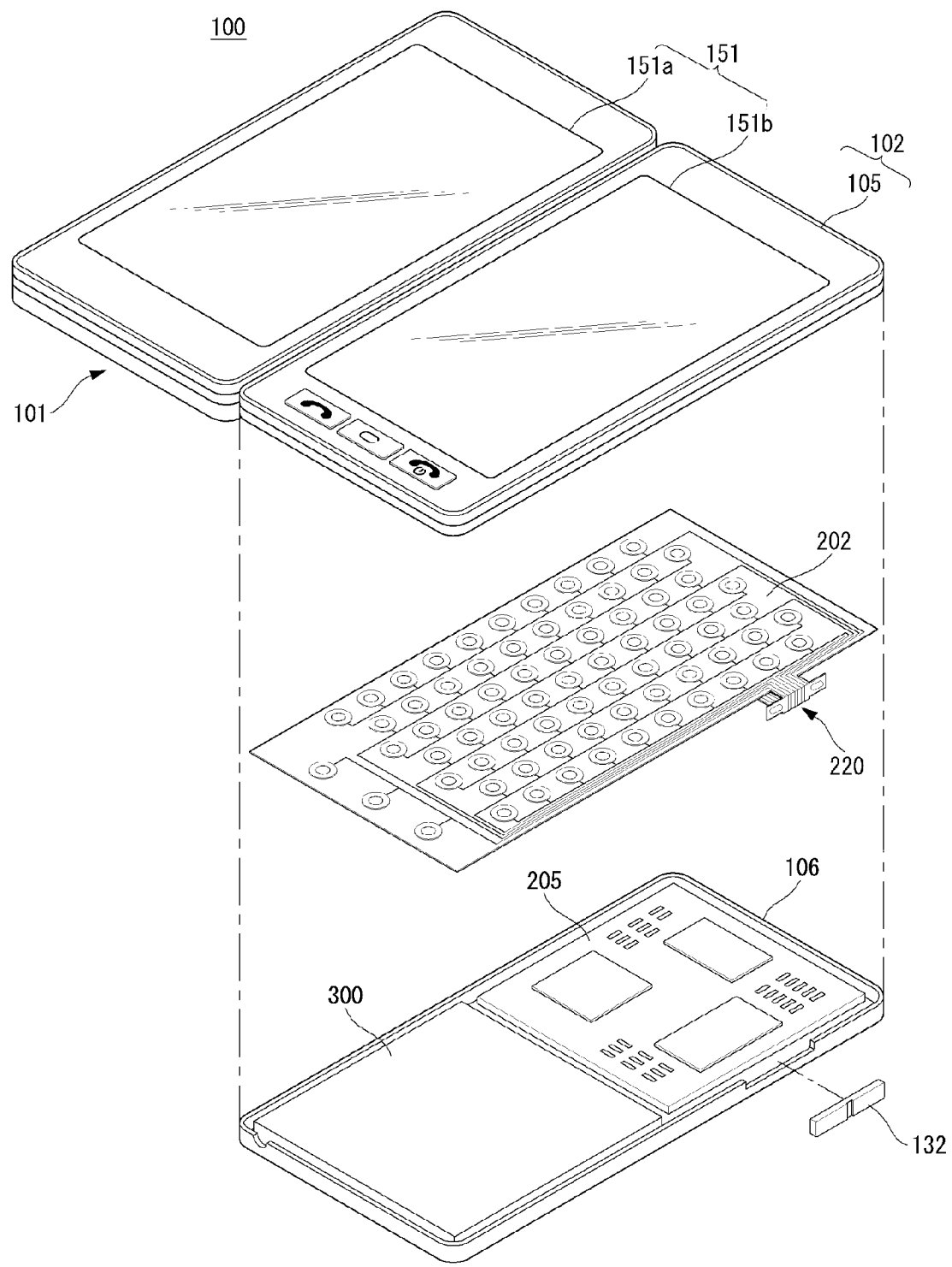
FIG. 15 is a view illustrating a flexible printed circuit board of a mobile terminal according to another embodiment of the present invention.

FIG. 15 is a view illustrating a flexible printed circuit board of a mobile terminal according to another embodiment of the present invention.

As shown therein, the mobile terminal 100 according to another embodiment of the present invention may include a plurality of displays 151.

The plurality of displays 151 may include first and second displays 151a and 151b. The first and second displays 151 may be placed on the front faces of the upper body 101 and the lower body 102. The upper body 101 and the lower body 102 may be coupled together slidably or by hinge.

The flexible printed circuit board 202 may provide a path of signal lines for the display of an image on the second display 151b and/or the delivery of a user's touch input signal for the second display 151b. That is, the flexible printed circuit board 202 may provide a path through which the user's input for the second display 151b is delivered to the printed circuit board 205.

The side keys 132 are coupled to the branch 220 extending from the flexible printed circuit board 202, such that the user's key input with respect to the side keys 132 can be acquired.

The printed circuit board 205 connected with the flexible printed circuit board 202 may be placed in a space that does not overlap a space in which the battery 300 is located.

Figure 16:
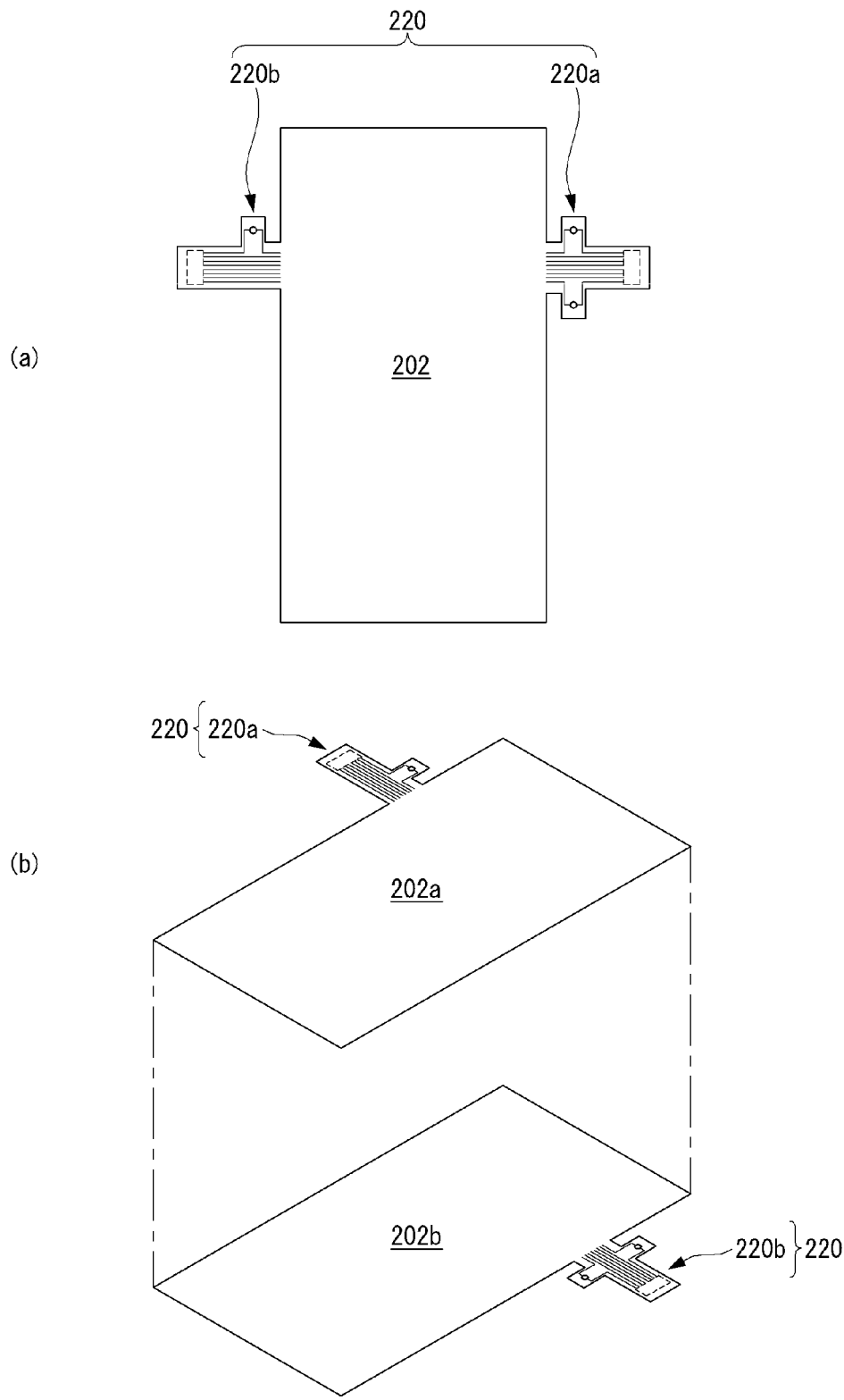
FIG. 16 is a view illustrating a flexible printed circuit board of a mobile terminal according to another embodiment of the present invention.

FIG. 16 is a view illustrating a flexible printed circuit board of a mobile terminal according to another embodiment of the present invention.

As shown therein, the flexible printed circuit board 202 of the mobile terminal according to another embodiment of the present invention may include branches provided in various forms.

As shown in FIG. 16A, the branches 220 may include first and second branches 220a and 220b. The first branch 220a and the second branch 220b may extend from the left and right sides of the flexible printed circuit board 202, respectively. That is, this means that the branches 220 respectively corresponding to an input key provided on the left portion of the mobile terminal 100 and an input key provided on the right portion of the mobile terminal 100 may extend from the flexible printed circuit board 202.

The number of dome switches provided on the first branch 220a may be different from that on the second branch 220b. For example, two dome switches may be provided on the first branch 220a while a single dome switch is provided on the second branch 220b.

As shown in FIG. 16B, the mobile terminal 100 may include first and second flexible printed circuit boards 202a and 202b. That is, this means that a stack of a plurality flexible printed circuit boards may be used.

The first and second branches 220a and 220b may extend from the first and second flexible printed circuit boards 202a and 202b, respectively. The directions in which the first and second branches 220a and 220b extend may be different from each other. For example, this means that the first branch 220a may extend to the left while the second branch 220b may extend to the right.

The first and second branches 220a and 220b may be different from each other in terms of the number of dome switches provided thereon. For example, this means that a single dome switch may be placed on the first branch 220a while a plurality of dome switches may be placed on the second branch 220b.

The above-described method of controlling the mobile terminal may be written as computer programs and may be implemented in digital microprocessors that execute the programs using a computer readable recording medium. The method of controlling the mobile terminal may be executed through software. The software may include code segments that perform required tasks. Programs or code segments may also be stored in a processor readable medium or may be transmitted according to a computer data signal combined with a carrier through a transmission medium or communication network.

The computer readable recording medium may be any data storage device that can store data that can be thereafter read by a computer system. Examples of the computer readable recording medium may include read-only memory (ROM), random-access memory (RAM), CD-ROMs, DVD±ROM, DVD-RAM, magnetic tapes, floppy disks, and optical data storage devices. The computer readable recording medium may also be distributed over network coupled computer systems so that the computer readable code is stored and executed in a distribution fashion.

A mobile terminal may include a first touch screen configured to display a first object, a second touch screen configured to display a second object, and a controller configured to receive a first touch input applied to the first object and to link the first object to a function corresponding to the second object when receiving a second touch input applied to the second object while the first touch input is maintained.

A method may be provided of controlling a mobile terminal that includes displaying a first object on the first touch screen, displaying a second object on the second touch screen, receiving a first touch input applied to the first object, and linking the first object to a function corresponding to the second object when a second touch input applied to the second object is received while the first touch input is maintained.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal, comprising:
a printed circuit board (PCB); and
a flexible printed circuit board (FPCB) coupled to the PCB, the FPCB comprising:
a main portion;
a branch portion extending from a first side of the main portion, the branch portion comprising a first end located at a distal end of the branch portion from the main portion;
at least one switch positioned on the branch portion, the at least one switch configured for receiving a key input signal; and
a connector coupled to the first end of the branch portion and configured for coupling the FPCB to the PCB.

2. The mobile terminal of claim 1, further comprising:
a body configured for housing the PCB and the FPCB, the body comprising a first side; and
at least one side key positioned on the first side,
wherein the at least one switch is a dome switch corresponding to the at least one side key.

3. The mobile terminal of claim 1, wherein the at least one switch is positioned between the first side of the main portion and the first end of the branch portion.

4. The mobile terminal of claim 1, further comprising a plurality of dome switches positioned on the main portion, each of the plurality of dome switches corresponding to a key in a QWERTY keyboard.

5. The mobile terminal of claim 1, further comprising:
a body configured for housing the PCB and the FPCB; and
at least one rib positioned on an inner surface of the body, the at least one rib configured for supporting the connector against the PCB when the connector is coupled to the PCB.

6. The mobile terminal of claim 1, further comprising:
a body configured for housing the PCB and the FPCB, the body including a battery receiving space positioned in an inner portion of the body,
wherein the PCB is positioned in a space in the inner portion of the body that does not overlap the battery receiving space.

7. The mobile terminal of claim 1, wherein:
the branch portion comprises at least one tab protruding from at least one side of the branch portion, the at least one tab forming a switch region of the branch portion; and
the at least one switch is positioned in the switch region.

8. The mobile terminal of claim 7, wherein:
the branch portion has a first width at a first portion positioned between the first side of the main portion and the at least one tab and a second width at a second portion positioned between the at least one tab and the first end; and
the first width is greater than the second width.

9. A mobile terminal, comprising:
a printed circuit board (PCB); and
a flexible printed circuit board (FPCB) coupled to the PCB, the FPCB comprising:
a main portion;
a branch portion extending from a first side of the main portion;
a signal line path positioned on the branch portion, the signal line path comprising a plurality of signal lines, each of the plurality of signal lines configured for conducting signals between the FPCB and the PCB, the plurality of signal lines including at least one lead wire;

at least one switch positioned on the signal line path, the at least one switch configured for receiving a key input signal; and a connector coupled to the branch portion and configured for coupling the plurality of signal lines to the PCB, wherein each lead wire of the at least one lead wire corresponds to a switch of the at least one switch and is configured for conducting the signals intermittently based on the received key input signal of the corresponding switch.

10. The mobile terminal of claim 9, further comprising:
a body configured for housing the PCB and the FPCB, the body comprising a first side; and
at least one side key positioned on the first side,
wherein the at least one switch is a dome switch corresponding to the at least one side key.

11. The mobile terminal of claim 9, wherein:
the at least one switch is positioned on a corresponding lead wire of the at least one lead wire between the first side of the main portion and a first end of the branch portion; and
the first end is located at a distal end of the branch portion from the main portion.

12. The mobile terminal of claim 9, further comprising a plurality of dome switches positioned on the main portion, each of the plurality of dome switches corresponding to a key in a QWERTY keyboard.

13. The mobile terminal of claim 9, wherein:
the branch portion comprises at least one tab protruding from at least one side of the branch portion, the at least one tab forming a switch region of the branch portion; and
the at least one switch is positioned in the switch region.

14. A flexible printed circuit board (FPCB), comprising:
a main portion;
an electronic component mounted on the main portion;
a branch portion extending from a first side of the main portion, the branch portion comprising a first end located at a distal end of the branch portion away from the main portion;

at least one switch positioned on the branch portion, the at least one switch configured for receiving a key input signal; and a connector coupled to the first end of the branch portion and configured for coupling the FPCB to another circuit board.

15. The FPCB of claim 14, wherein the at least one switch is positioned along a signal line path positioned on the branch portion between the first side of the main portion and the first end of the branch portion.

16. The FPCB of claim 14, wherein:
the branch portion comprises at least one tab protruding from at least one side of the branch portion, the at least one tab forming a switch region of the branch portion; and the at least one switch is positioned in the switch region.

17. The FPCB of claim 16, wherein:
the branch portion has a first width at a first portion positioned between the first side of the main portion and the at least one tab and a second width at a second portion positioned between the at least one tab and the first end; and the first width is greater than the second width.

18. The mobile terminal of claim 2, further comprising a frame positioned within the body, the frame configured to support the FPCB against an external force received on the at least one side key.

19. The mobile terminal of claim 10, further comprising a frame positioned within the body, the frame configured to support the FPCB against an external force received on the at least one side key.

* * * * *